(12) United States Patent
Martens (10) Patent No.: US 6,650,123 B2
(45) Date of Patent: Nov. 18, 2003

(54) METHODS FOR DETERMINING CHARACTERISTICS OF INTERFACE DEVICES USED WITH VECTOR NETWORK ANALYZERS

(75) Inventor: Jon S. Martens, San Jose, CA (US)

(73) Assignee: Anritsu Company, Morgan Hill, CA (US)

( * ) Notice: Subject to any disclaimer, the term of this patent is extended or adjusted under 35 U.S.C. 154(b) by 21 days.

(21) Appl. No.: 10/050,305

(22) Filed: Jan. 15, 2002

(65) Prior Publication Data

US 2003/0132758 A1 Jul. 17, 2003

(51) Int. Cl.$^7$ ............................................... G01R 27/28
(52) U.S. Cl. ........................................ 324/601; 324/638
(58) Field of Search ................................ 324/638, 601, 324/605, 606, 609, 612, 629, 632; 702/85

(56) References Cited

U.S. PATENT DOCUMENTS

| | | | | |
|---|---|---|---|---|
| 5,578,932 A | | 11/1996 | Adamian | 324/601 |
| 5,748,506 A | * | 5/1998 | Bockelman | 702/85 |
| 6,188,968 B1 | | 2/2001 | Blackham | 702/85 |
| 6,300,775 B1 | * | 10/2001 | Peach et al. | 324/601 |

OTHER PUBLICATIONS

Anritsu Model 360B Vector Network Analyzer, Operation Manual, Revision: F, Oct., 1997, Chapters 3, 4, 5, 6, 7, 8 and 9, pp. 3–4 to 9–46.

Application Note, Anritsu, Reflectometer Measurements—Revisited, Apr., 2000, Rev. C, 12 pages.

Bauer, R.F.; Penfield, Jr., P., "De–Embedding and Unterminating", IEEE Transactions Of Microwave Theory and Technique, vol. MTT–22, No. 3, Mar. 1974, pp. 282–288.

Daywitt, W.C., "Determining Adapter Efficiency by Envelope Averaging Swept Frequency Reflection Data", IEEE Transactions On Microwave Theory and Techniques, vol. 38, No. 11, Nov. 1990, pp. 1748–1752.

Edwards, M.L., "Calibration and Measurements of S–Parameters", *Microwave & RF Circuits: Analysis, Design, Fabrication & Measurement,* Chapter 7, Sep. 7, 2001, 23 pages.

Glasser, L.A., "An Analysis of Microwave De–embedding Errors", IEEE Transactions on Microwave Theory and Techniques, vol. MTT–26, No. 5, May 1978, pp. 379–380.

King, J.D.; Biron, B., "Direct Chararcterization of Non–Insertable Microwave Test Fixtures For Packaged MMICs"; 57$^{th}$ ARFTG Dig, May 2001, pp. 19–27.

Matthew, P.J., Song, J.J., RF Impedance Measurement Calibration, Advanced Photon Source, Argonne National Laboratory, Feb. 12, 1993, 16 pages, World Wide Web Page, URL=http://www.aps.anl.gov/techpub/lsnotes/ls223/is223.html, visited Nov. 12, 2001.

Nelson, R., "What are S–parameters, anyway?", Test & Measurement World, Feb. 2001, 9 pages, World Wide Web page, URL=http:///www.tmworld.com/articles/2001/02_sparameters.htm, visited Nov. 13, 2001.

(List continued on next page.)

Primary Examiner—N. Le
Assistant Examiner—Vincent Q. Nguyen
(74) Attorney, Agent, or Firm—Fliesler Dubb Meyer & Lovejoy LLP (57) ABSTRACT

Methods are provided for characterizing N interface devices (e.g., adapters or test fixture arms) using a vector network analyzer (VNA). These N interface devices are useful for connecting an N-port device under test (DUT) to the VNA. A first step of includes performing an N-port calibration at each of N outer reference planes. A second step includes performing an N-port calibration at each of N inner reference planes. A set of scattering-parameters (S-parameters) is then determined for each of the N interface devices based on results of the calibrations performed at the first step and results of the calibrations performed at the second step. Each set of S-parameters characterizes a respective one of the N interface devices.

22 Claims, 9 Drawing Sheets

OTHER PUBLICATIONS

"Network Analyser Calibration", World Wide Web page, URL=http://www.morph.demon.co.uk/Electronics/new.htm, visited Nov. 13, 2001, 12 pages.

Pollard, R.D., Lane, R.Q., "The Calibration Of A Universal Test Fixture", 1983 MIT–S Digest, pp. 498–500 Month ?.

Product Note, Aglient 8510–13, "Measuring Noninsertable Devices," Agilent Technologies, Aug. 1988, 15 pages.

Randa, J.; Wiatr W.; Billinger, R., "Comparison of Adapter Characterization Methods," IEEE Trans. on MTT, vol. 47, Dec. 1999, pp. 2613–2620.

Silvonen, K., Calibration and De–Embedding of Microwave Measurements Using Any Combination of One–or Two–port Standards, Circuit Theory Laboratory CT–4, Dec. 1987, Helsinki University of Technology, 28 pages.

Tippet, J.C.; Speciale, R.A., "A Rigorous Technique for Measuring the Scattering Matrix of a Multiport Device with a 2–Port Network Analyzer," IEEE Transactions on Microwave Theory and Techniques, vol. MIT–20, No. 5, May 1992, pp. 661–666.

Wiatr, W., "A Method for Embedding Network Characterization with Application to Low–loss Meaurements," IEEE Transactions On Instruments and Measurments, vol. 36, Jun. 1987, pp. 487–490.

Eberly, Mike: Dunleavy, L., "Intro to the Agilent 8714—RF Network Analyzer", Agilent Technologies, EducatorsCorner.com Experiments, 7 pages (date unkown).

Gonzalez, Ph.D., G., *Microwave Transistor Amplifiers Analysis and Design*, Prentice–Hall,, Inc., New Jersey, Chapters 1 and 2, pp. 1–90, Aug. 1996.

Pollard, R.D., Lane, R.Q., "The Calibration Of A Universal Test Fixture", 1983 MIT–S Digest, pp. 498–500 (year of publicaiton is sufficiently earlier than the effective U.S. filing date and any foreign priority date so that the particular month of publication is not at issue, in accordance with MPEP §609.III.A).

Vaitkus, R., Scheitlin, D., A Two–Tier Deembedding Technique For Packaged Transistors, 1982 IEEE–S Digest, pp. 328–330 (year of publication is sufficiently earlier than the effective U.S. filing date and any foreign priority date so that the particular month of publication is not at issue, in accordance with MPEP §609.III.A).

Williams, D.F., Walker, D.K., "In–Line Multiport Calibration Algorithm," in $51^{st}$ ARFTG Conf. Dig., Jun. 12, 1998, pp. 88–90.

Wiltron/Anritsu Company documentation for the 360B and 37xxx network analyzers, pp. 8–34 to 8–38 (date unknown).

* cited by examiner

Cal plane

Perform 1st cal between these two coax connectors

Thru connect between probes

FIG. 6B

Perform 2nd cal between the probe tips using wafer standards

FIG. 6C

Thru connect between probes

Perform 3rd cal between these two coax connectors

Put reference planes here

Wafer probe state irrelevant during this step

Perform 1st cal between these outer two coax connectors

FIG. 11B

Perform 2nd cal between the probe tips using wafer standards

METHODS FOR DETERMINING CHARACTERISTICS OF INTERFACE DEVICES USED WITH VECTOR NETWORK ANALYZERS

BACKGROUND OF THE INVENTION

1. Field of the Invention

The present invention relates to methods for characterizing interface devices, such as adapters, test fixtures and other networks, used with a vector network analyzer (VNA). More particularly, the present invention relates to methods for determining scattering-parameters (S-parameters) of such interface devices.

2. Description of the Related Art

A vector network analyzer (VNA) is an instrument that is typically used to measure complex transmission and reflection characteristics of devices under test (DUTs). Different DUTs can have different types of connection configurations at their ports. For example, a two-port DUT can have one of many of possible configurations of connectors at its two ports. Some DUTs, known as "insertable" DUTs, have two connectors that are from the same connector family and of opposite sex, one connector being male and the other being female. An insertable two-port DUT is configured such that calibration can be performed by connecting ports of a VNA together with the aid of a cable to establish a thru-connection, during calibration, and without having to change the configuration measurement setup for the actual measurement of the DUT.

In contrast, a "non-insertable" DUT cannot be connected to the two ports of a VNA without use of adaptors or other test fixture arms (referred to collectively hereafter as interface devices). An example of a non-insertable device is a "reversible device," which has two connectors of the same family, but also of the same sex (i.e., both being male or female). Another example of a non-insertable DUT is a transitional device that has two connecters that are of different families (e.g., one connector being a coaxial cable and the other being a waveguide). Stated generally, interface devices (e.g., an adapters or test fixture arms) are required when using a VNA to make measurements of certain devices (e.g., non-insertable devices).

When interface devices are used to connect DUTs to a VNA, there is a need to remove the effects of such interface devices. This can be accomplished by determining the scattering-parameters (S-parameters) of the interface devices in question and then de-embedding (i.e., mathematically removing) them from measured data. The present invention relates to characterizing of interface devices. Accordingly, the focus hereafter shall be directed to characterizing interface devices, and any discussion of de-embedding (methods of which are well known in the relevant art) will be limited.

Figure 1:
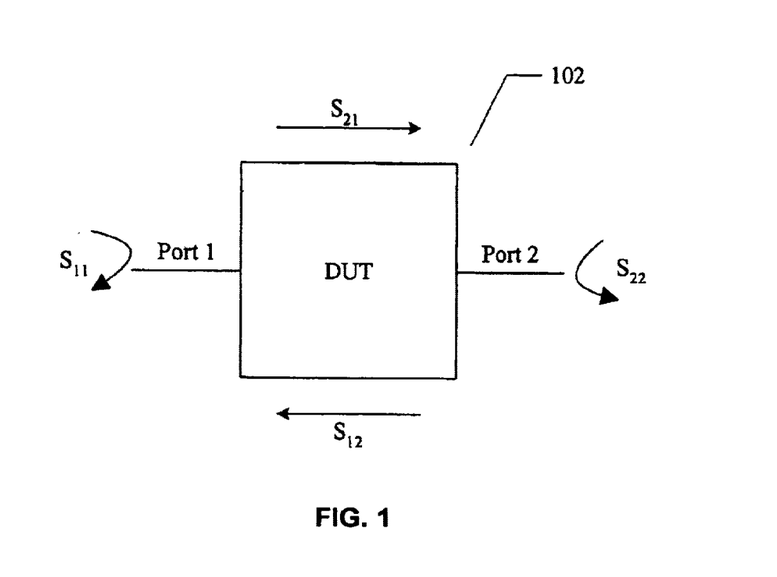
FIG. 1 is a block diagram of an exemplary two-port device under test (DUT) and its associated S-parameters.

S-parameters of a multi-port device characterize how the device interacts with signals presented to the various ports of the device. An exemplary S-parameter is "$S_{12}$." The first subscript number is the port that the signal is leaving, while the second is the port that the signal is being injected into. $S_{12}$, therefore, is the signal leaving port 1 relative to the signal being injected into port 2. The four S-parameters associated with an exemplary two-port device 102 are represented in FIG. 1, where:

$S_{11}$ is referred to as the "forward reflection" coefficient, which is the signal leaving port 1 relative to the signal being injected into port 1;

$S_{21}$ is referred to as the "forward transmission" coefficient, which is the signal leaving port 2 relative to the signal being injected into port 1;

$S_{22}$ is referred to as the "reverse reflection" coefficient, which is the signal leaving port 2 relative to the signal being injected into port 2; and $S_{12}$ is referred to as the "reverse transmission" coefficient, which is the signal leaving port 1 relative to the signal being injected into port 2.

Figure 2:
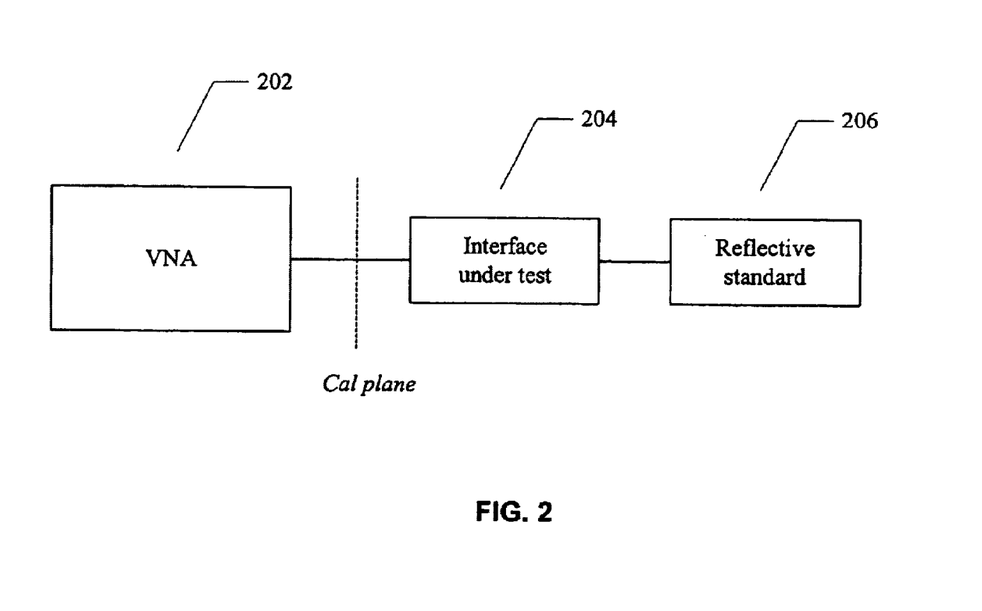
FIG. 2 is a block diagram that is useful for describing the "reflective-termination" technique for characterizing an interface device under test.

A number of procedures have been developed for determining the S-parameters of interface devices (e.g., adapters). In a first technique, referred to hereafter as method A, S-parameters are determined using a simple one port calibration and some measurements with an interface device in place. Method A (often known as the "reflective-termination" method) shall be described with reference to FIG. 2, which shows a first port of a two-port interface device under test 204 coupled to a calibration port of a VNA 202 and a second port of interface device under test 204 coupled to reflective standards 206. Reflective standards 206 normally have reflective coefficient magnitudes of unity and phases differing by pi ($\pi$). Method A, however, can only determine one reflection coefficient (i.e., $S_{11}$). Further, the high dependence on the standards quality (i.e., the quality of reflective standards 206), among other reasons, tends to increase the uncertainty of this method and can lead to larger errors than may be acceptable.

Figure 3A:
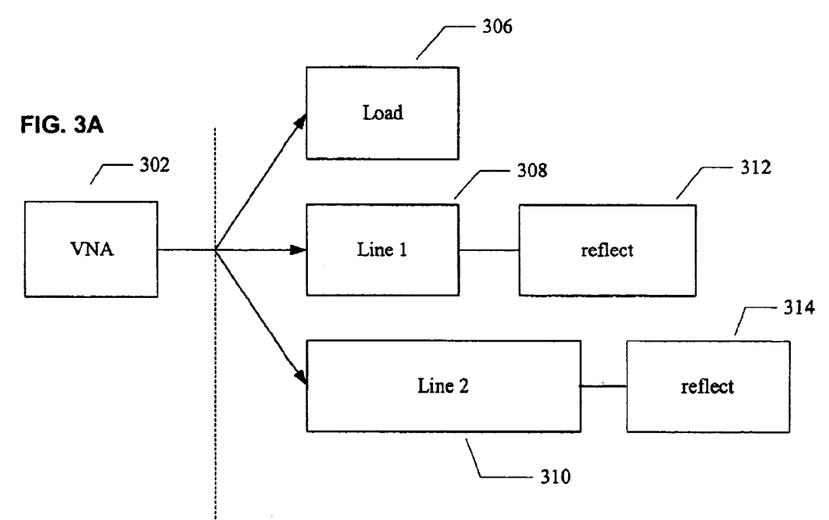
FIG. 3 is a block diagram that is useful for describing the "multi-line one-port" technique for characterizing an interface device under test.
Figure 3B:
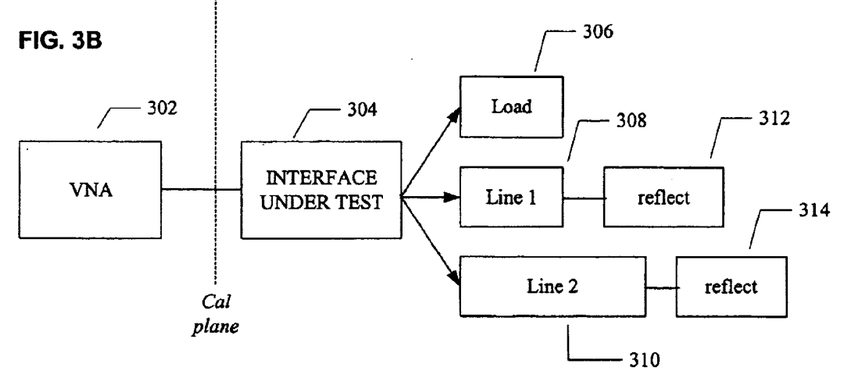

A second technique, referred to hereafter as method B, is similar to method A but uses multiple line lengths after the interface device to acquire more information. Method B (often known as the "multiline one-port" method), illustrated in FIGS. 3A and 3B, can be used to extract all S-parameters and is less dependent on standards quality. However, method B is relatively complicated, even for a single port. In method B, a VNA 302 is used to make a series of measurements of several standards (typically a load 306 plus several line lengths 308, 310 with reflective standards 312, 314 attached) both with an interface device under test 304 present (as shown in FIG. 3B) and absent (as shown in FIG. 3A). Accordingly, for a multi-port structure (i.e., an N-port structure, where N≧2), method B can be quite time consuming. Further, in a fixtured or probing environment, a non-coaxial side of interface device 304 may be extremely space constrained so it may not be practical to construct the different line lengths required for method B. Since the differences in line length must be of the order $\lambda/4$ at the operating frequency, this problem is particularly acute in the radio frequency (RF) ranges where the manufacturing need for such a method is greatest. Additionally, more line lengths than two are needed for broader frequency ranges.

Figure 4A:
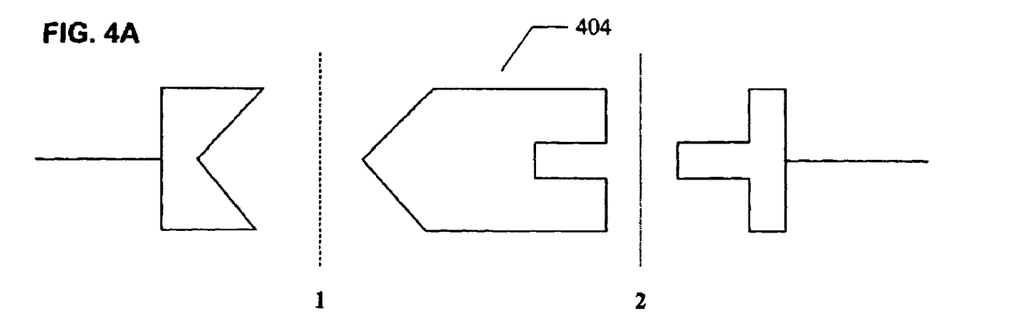
FIG. 4 is a block diagram that is useful for describing the "two-port adapter removal" technique for characterizing an interface device under test.
Figure 4B:
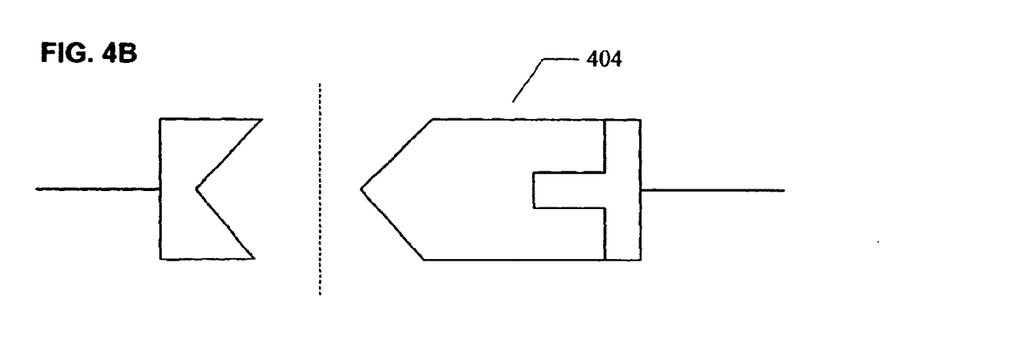
Figure 4C:
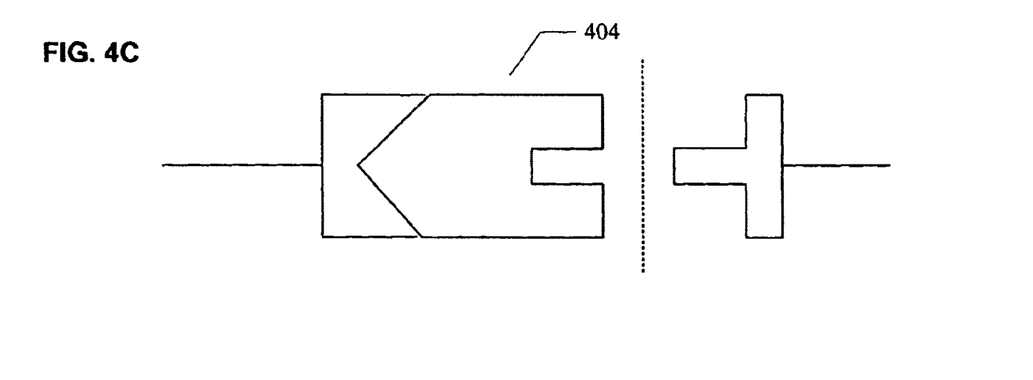

A third technique, referred to hereafter as method C, uses two port calibrations at both ends of an interface device under test to determine the full S-parameters of the interface device. Method C is illustrated in FIG. 4 for a single interface device under test 404 (e.g., a fixture arm). While this process can work for a single interface device, it becomes quite time-consuming for N interface devices (e.g., an N-port fixture structure) and many calibrations maybe required. The following is a description of how method C would be used in a common two port problem.

Figure 5:
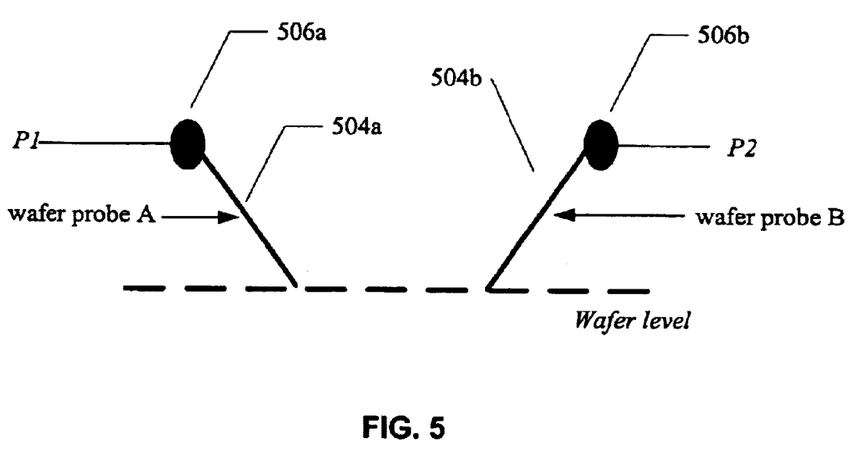
FIG. 5 illustrates two wafer probe interface devices that are useful for connecting a wafer under test to a VNA.

Consider a wafer-probe environment where the desire is to find the S-parameters of the probes themselves (i.e., each probe is considered a two-port interface devices in this example). To implement method C, a pair of calibrations are required for each port, resulting in a total of four calibrations (although, all may not be needed in some cases). This basic example is shown in FIG. 5. Referring to FIG. 5, two interface devices 504a and 504b (i.e., wafer probe A and wafer probe B) are connected, respectively, to port 1 (P1) and port 2 (P2) of a VNA (not shown). As just mentioned, the desire is to find the S-parameters for the wafer probes (i.e., interface devices 504a and 504b) themselves.

Figure 6A:
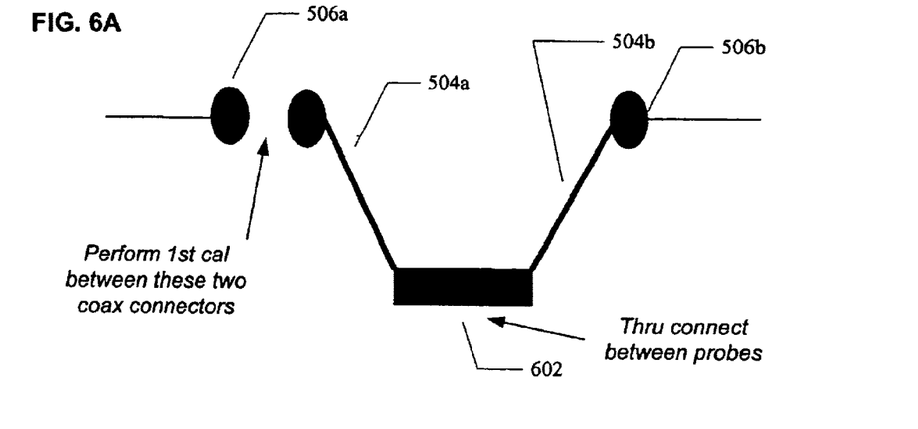
FIGS. 6A–6C illustrate that the two wafer probe interface devices of FIG. 5 are useful for describing how the "two-port adapter removal" technique is applied.
Figure 6B:
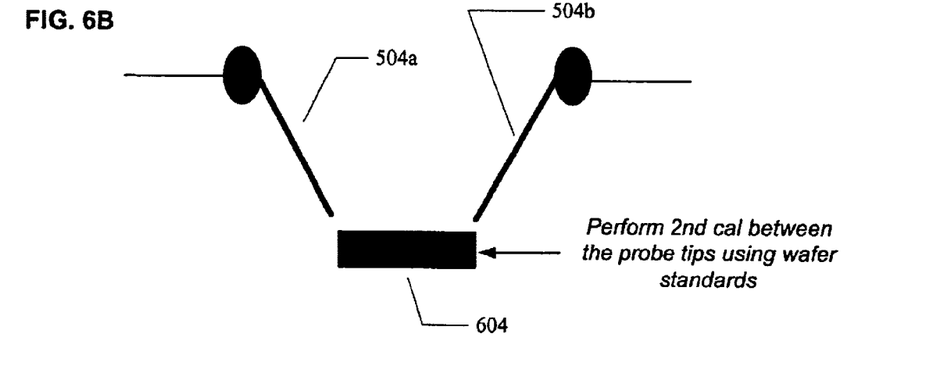
Figure 6C:
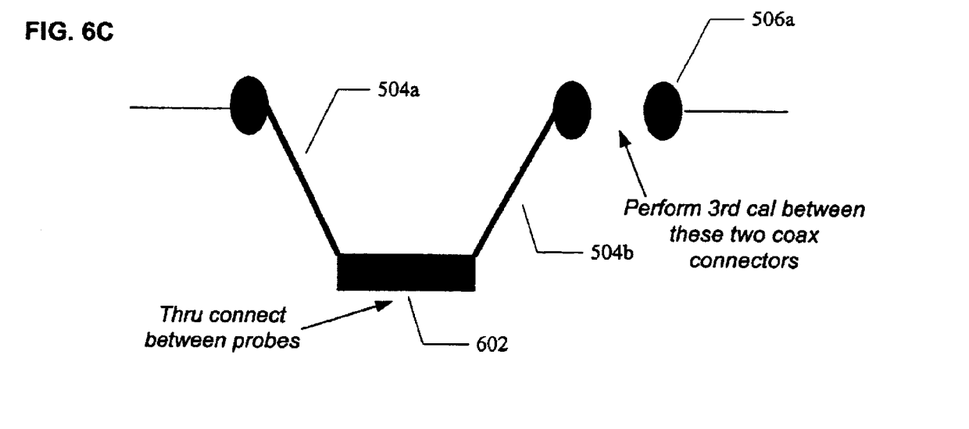

The use of method C to find the S-parameters for the probes will now be described with reference to FIGS. 6A–6C. Using method C, a two port calibration at coaxial connector 506a is first performed. For this to make sense, the two wafer probes 504a and 504b must be connected by a thru 602, as shown in FIG. 6A. This is a critical step since this must be a true thru (i.e., no extra parasitics and reference planes in the wafer domain must be aligned). Further, extra length cannot be easily corrected for since there is an effect on the mismatch at the two wafer probes 504a and 504b. The next calibration is performed at the wafer level using commonly available calibration substrates 604, as shown in FIG. 6B. As just suggested, the reference planes established by this calibration must agree with the thru used in the first calibration. Also, the inflexibility associated with the interface device connection on the first calibration is important since there are often physical limitations on how this connection can be established with a real interface device (e.g., a real test fixture). The second calibration sequence needs a calibration at coaxial connector 506b, as shown in FIG. 6C, and the wafer level calibration can be re-used in this case to get the S-parameters of wafer probe 504b.

Figure 7:
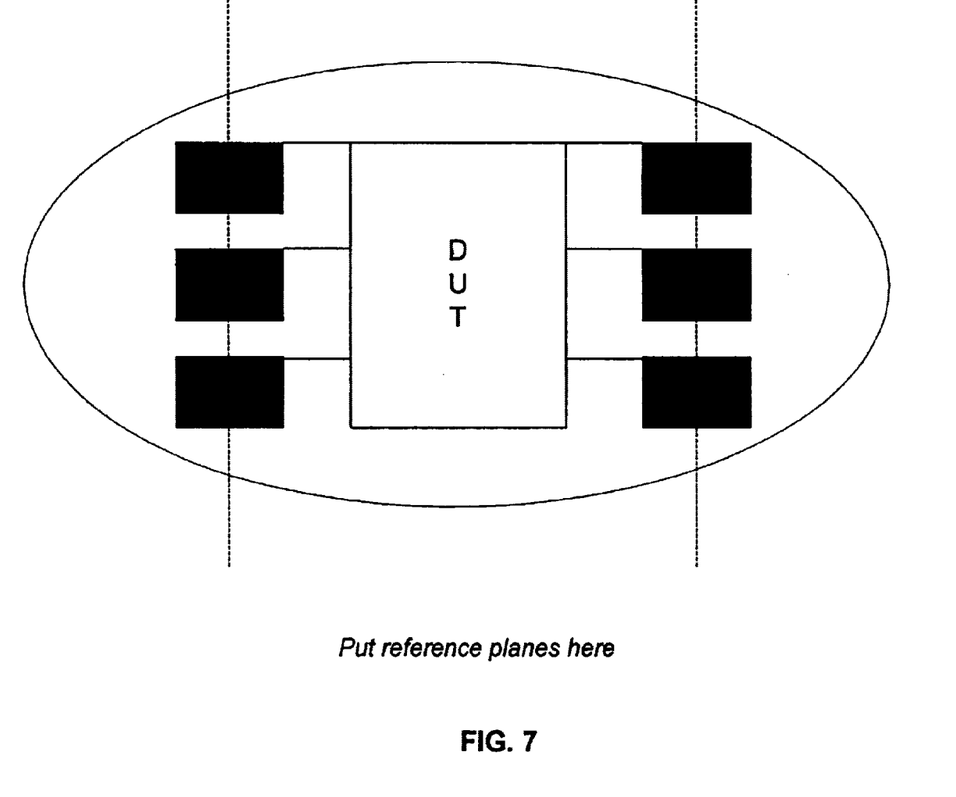
FIG. 7 is a block diagram illustrating a six-port device under test.

To better understand the problem of wafer thru 602, consider the DUT outline shown in FIG. 7. In order to get the S-parameters of the DUT correctly, the reference planes for the second calibration should be established as shown (at the DUT terminals). A non-zero length thru is used during the second calibration (which is acceptable and correctable). However, when trying to create a true thru for the first and third calibrations, this presents a problem since there is a non-zero length between the desired reference planes. Accordingly, either some phase inaccuracy must be tolerated or the reference planes must be manually adjusted after the calibration, both of which are undesirable.

As discussed above, several methods exist for interface device characterization. Some are one port techniques that only reveal some of the S-parameters of the interface device. With some methods, all of the S-parameters are revealed, but several measurements and/or calibrations are typically required (especially for N-port fixtured or probed environments). Additionally, such methods may place constraints on the physical configurations of the interface devices. Accordingly, there is a need for a method for determining all relevant S-parameters of interface devices in a time-efficient and cost-efficient manner using a reduced number of measurements and/or calibrations.

BRIEF SUMMARY OF THE INVENTION

The present invention is directed toward methods for determining the S-parameters of interface devices (e.g., adapters or test fixtures). The method of the present invention generates all S-parameters needed for de-embedding interface devices. Additionally, the present invention is geometrically feasible for a tight fixtured or probing environment. Further, the present invention is much more amenable for use in a multiport fixtured environment. Due to the increasing use of such multiport testing in manufacturing, a time efficient technique of extraction is quite important.

An embodiment of the present invention is directed to a method for characterizing N interface devices using a vector network analyzer (VNA). These N interface devices are useful for connecting an N-port device under test (DUT) to the VNA. A first step of the method includes performing an N-port calibration at each of N outer reference planes. Each outer reference plane is defined by a first port of one of the N interface devices. The first port of the each interface device is for connecting to the VNA (e.g., directly to a port of the VNA, or to a cable that is attached to the port of the VNA). The outer calibrations produce a set of outer reference plane error coefficients for each of the N interface devices, including a directivity error coefficient (edn), a source match error coefficient (epnS), and a reflection tracking error coefficient (etnn).

A second step of the method of the present invention includes performing an N-port calibration at each of N inner reference planes. Each of the inner reference planes is defined by a second port of one of the N interface devices. The second port of each interface is for connecting to one of the ports of the DUT. The inner calibrations produce a set of inner reference plane error coefficients for each of the N interface devices of the VNA, including a directivity error coefficient (edn'), a source match error coefficient (epnS'), and a reflection tracking error coefficient (etnn').

After the inner and outer calibrations are performed, a set of S-parameters is determined for each of the N interface devices based on the results of the calibrations. More specifically, N sets of S-parameters are determined using equations that calculate S-parameters based on the error coefficients, such as edn, edn', etc., determined during the calibrations. Each set of S-parameters characterizes a respective one of the N interface devices. The S-parameters of the interface devices can then be used to de-embed the interface devices from measured data, using conventional de-embedding techniques. If desired, the S-parameters can alternatively be used to embed interface devices into measured data.

Additional features and advantages of the present invention, as well as the operation of various embodiments of the present invention, are described in detail below with reference to the accompanying drawings.

BRIEF DESCRIPTION OF THE DRAWINGS/ FIGURES

The features, objects, and advantages of the present invention will become more apparent from the detailed description set forth below when taken in conjunction with the drawings in which like reference characters identify the same or similar elements throughout and wherein.

DETAILED DESCRIPTION OF THE INVENTION

Unlike methods A and B, the present invention (also referred to as the "extraction method" of the present invention) uses full calibrations to extract interface device characteristics. Unlike method C, the extraction method of the present invention treats a multi-port adaptor or test-fixture (i.e., multiple interface devices) as one entity, rather than as multiple two-port networks that are treated one two-port network at a time. With the present invention, two full calibrations are performed: one at the outer planes associated with each interface device; and one at the inner planes associated with each interface device. This will be explained in more detail below, with the aid of examples.

Like methods A, B and C discussed above, standards must be connected at the DUT plane, and thus, the standards may be of an unusual form factor (e.g., microstrip). Similar to methods B and C, the absolute quality of the standards is not hypercritical. However, the calibrations must be of good quality. Because an adaptor is treated as a whole, it is somewhat easier to handle thru line lengths and other parasitics at the DUT planes.

Figure 8:
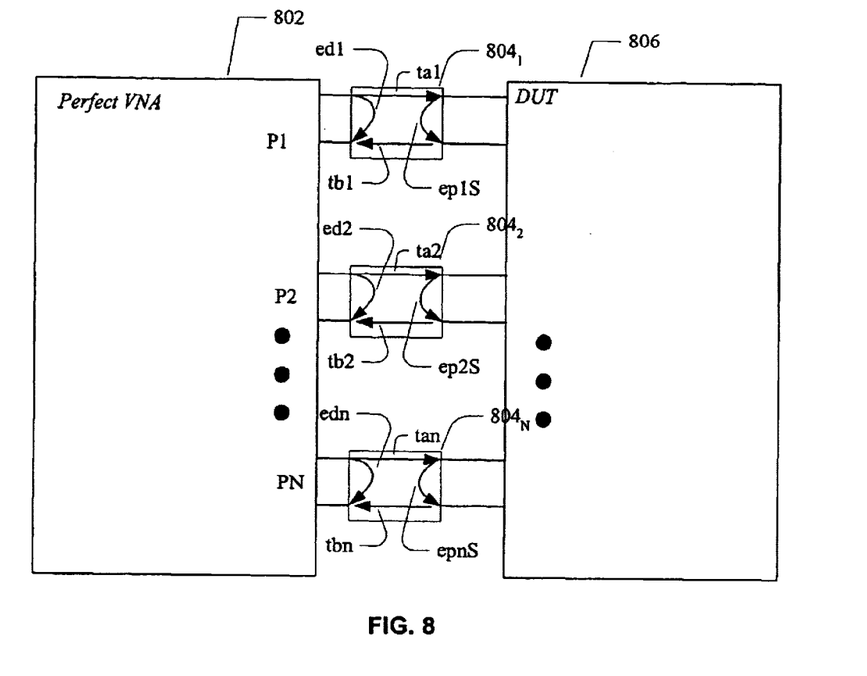
FIG. 8 is a block diagram illustrating error coefficients that can be determined during calibration.

Prior to explaining the extraction method of the present invention in more detail, it is helpful to first discuss specific error correction coefficients generated during calibration. These shall be discussed with reference to FIG. 8, which shows a VNA 802 connected to a multi-port DUT 806. Error coefficients are lumped and represented in each error box $804_1$ $804_2$ and $804_n$. As shown in FIG. 8, there are three complex error coefficients associated with each n port:

| | |
|---|---|
| edn | the directivity error coefficient at the $n^{th}$ port (e.g., ed1 at port 1), |
| epnS | the source match error coefficient at the $n^{th}$ port (e.g., ep1S at port 1), and |
| etnn | the reflection tracking error coefficient at the $n^{th}$ port (e.g., et11 at port 1), where etnn = tan · tbn. |

In addition, there is a pair of transmission tracking terms (etmn and etnm) between every pair of ports m and n (e.g., et12 and et21 between ports 1 and 2). Isolation terms can also be computed, but they are not often used, and thus will not be discussed.

It is noted that other equivalent names are often used for the above discussed error coefficients, as would be known by one of ordinary skill in the art. For example, directivity is often referred to as coupler leakage. For another example, source match is often referred to as forward match. Further, one of ordinary skill in the art would also appreciate that the use of other equivalent error models would be within the spirit and scope of the present invention.

Since two calibrations are performed, there will result two sets of error coefficients for each n port: a set for the outer reference plane calibration; and a set for the inner reference plane calibration. A set of error coefficients determined during an outer reference plane calibration relates to errors associated with a port of a VNA (and any cables, switches and/or other components that are attached to the port of the VNA), but not errors associated with an interface device being characterized. A set of error coefficients determined during an inner reference calibration relates to the errors associated with a port of a VNA (and any cables, switches and/or other components that are attached to the port of the VNA) plus errors associated with the interface device being characterized. Based on the two sets of error coefficients, errors associated primarily with the interface device can be extracted, as will be explained in more detail below.

Each interface device that is characterized using the present invention can be thought of as a two-port device, having a first port that connects to a VNA (or to a cable attached to the VNA) and the second port that connects to a DUT. A calibration plane at the first port of an interface device (i.e., the port that connects to a port of the VNA) is referred to hereafter as an outer reference plane. A calibration plane at the second port of an interface device (the port that connects to a port of the DUT) is referred to hereafter as an inner reference plane. Error coefficients associated with an inner reference plane are denoted herein with a prime (e.g., edn'). Error coefficients associated with an outer reference plane are denoted without a prime (e.g., edn). Thus, each port n refers to an outer reference plane at which a calibration is made. Each port n' refers to an inner reference plane at which a calibration is made.

Directivity error coefficients for port n and port n' are related by:

$$edn' = \frac{edn - \Delta^A S_{11}^n}{1 - epnS \cdot S_{11}^n} \quad (1)$$

where, $$\alpha^A = edn \cdot epnS - etnn,$$

edn' is the directivity error coefficient at port n' (the second port of the $n^{th}$ interface device) determined during an inner reference plane calibration, edn is the directivity error coefficient at port n (the first port of the $n^{th}$ interface device) determined during an outer reference plane calibration, epnS is the source match error coefficient at port n (the first port of the $n^{th}$ interface device) determined during an outer reference plane calibration, etnn is the reflection tracking error coefficient at port n (the first port of the $n^{th}$ interface device) determined during an outer reference plane calibration, and $S_{11}^n$ is the forward reflection coefficient for the $n^{th}$ interface device (i.e., the signal leaving port 1 of the $n^{th}$ interface device relative to the signal being injected into port 1 of the interface device).

Equation 1 can be used to solve for $S_{11}$ for the $n^{th}$ interface device (i.e., $S_{11}^n$ resulting in Equation 2 shown below. Remember, the first port (i.e., port 1) of the interface devices defines an outer reference plane (e.g., the first port of the interface device attaches to a port of a VNA, or to a cable attached to the port of the VNA). It is noted that there could be another network (e.g., a switch matrix) between the VNA and the outer plane. It doesn't really matter what this network is so long as the insertion loss and/or mismatch are not extremely poor, since that network will be compensated for in the outer reference plane calibrations.

$$S_{11}^n = \frac{edn' - edn}{epnS(edn' - edn) + etnn} \quad (2)$$

A similar analysis on the reflection tracking term produces Equation 3a shown below. Here the second port (i.e., port 2) of the interface device is defined as the port that is closest to a corresponding inner reference plane (e.g., the port of the $n^{th}$ interface device that attaches to a DUT.).

$$etnn' = \frac{S_{21}^n S_{12}^n etnn}{(1 - epnS \cdot S_{11}^n)^2} \quad (3a)$$

where, etnn' is the reflection tracking error coefficient at port n' (the second port of the $n^{th}$ interface device) determined during an inner reference plane calibration, etnn is the reflection tracking error coefficient at port n (the first port of the $n^{th}$ interface device) determined during an outer reference plane calibration, epnS is the source match error coefficient at port n (the first port of the $n^{th}$ interface device) determined during an outer reference plane calibration, $S_{21}^n$ is the forward transmission coefficient for the $n^{th}$ interface device (i.e., the signal leaving port 2 of the $n^{th}$ interface device relative to the signal being injected into port 1 of the interface device), and $S_{12}^n$ is the reverse transmission coefficient for the $n^{th}$ interface device (i.e., the signal leaving port 1 of the $n^{th}$ interface device relative to the signal being injected into port 2 of the interface device).

Equation 3a can be used to solve for $S_{21}S_{12}$, since $S_{11}$ is already known, resulting in Equation 3b shown below.

$$S_{21}^n S_{12}^n = \frac{etnn'(1 - epnS \cdot S_{11}^n)^2}{etnn} \quad (3b)$$

As with methods A, B and C discussed above, which can only solve for the product of $S_{21}S_{12}$, a reciprocity assumption is usually invoked (i.e., $S_{21}=S_{12}$). If the purpose is to use the fixture data for de-embedding, it is largely immaterial since the de-embedding calculation method only needs the product $S_{21}S_2$. However, if the reciprocity assumption is made and the square root of Equation 3b is taken to get $S_{21}$, care should be taken with the complex branch cut.

Proceeding with analysis of source match solves for $S_{22}$ of the interface device n, as shown below in Equations 4a and 4b.

$$epnS' = \frac{S_{22}^n - \Delta^n epnS}{1 - epnS \cdot S_{11}^n} \quad (4a)$$

$$S_{22}^n = epnS' - \frac{S_{21}^n S_{12}^n epnS}{1 - epnS \cdot S_{11}^n} \quad (4b)$$

Cross terms can also be obtained using Equation 5 shown below, although they are somewhat redundant. They are potentially useful, however, for insertion of non-zero length thru information. In Equation 5, epmL is the load match error coefficient at the $m^{th}$ port.

$$S_{12}^m S_{21}^n = \frac{etmn'(1 - S_{11}^n epnS)(1 - S_{11}^m epmL)}{etmn} \quad (5)$$

Figure 9A:
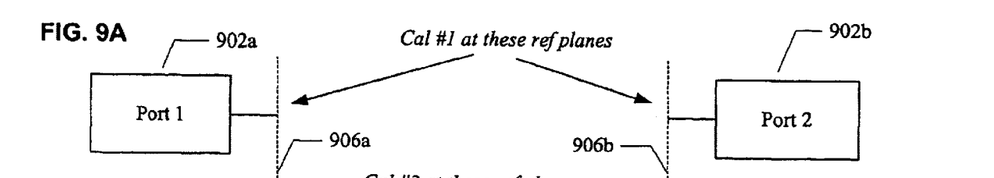
FIGS. 9A and 9B are block diagrams that are useful for describing how the extraction method of the present invention can be used to characterize two interface devices.
Figure 9B:
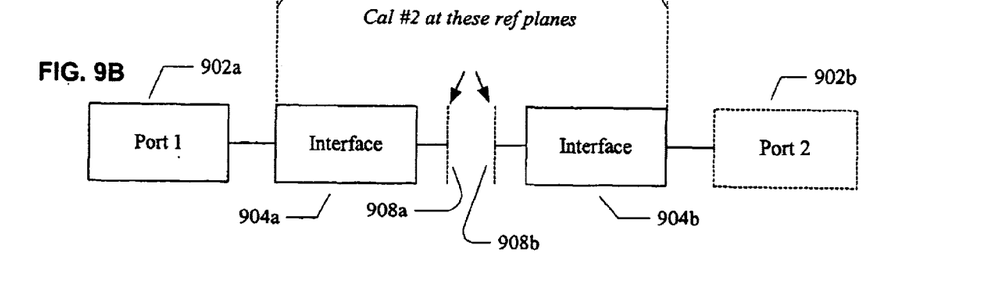

Using equations 2, 3b and 4b, sufficient information can been extracted to de-embed interface devices (e.g., wafer probes). It has been assumed that there is negligible leakage between interface devices. It may be possible to correct for that, if desired, using isolation calibration terms. The extraction method in accordance with the present invention is summarized with reference to the block diagrams of FIGS. 9A and 9B and the flow diagram of FIG. 10. Referring to FIGS. 9A and 9B, a first interface device 904a is connected (directly, or more likely through a cable) to a first port 902a of a VNA. Similarly, a second interface device 904b is connected (directly, or more likely through a cable) to a second port 902b of the VNA. Interface devices 904a and 904b can be, for example, wafer probes, as discussed above. Such interface devices 904a and 904b are used to connect a DUT (not shown) to the VNA, so that the VNA can measure characteristics of the DUT. The extraction method of the present invention can be used to characterize interface devices 904a and 904b. This information can then be used to de-embed the interface devices 904a and 904b from measured data of a DUT.

Figure 10:
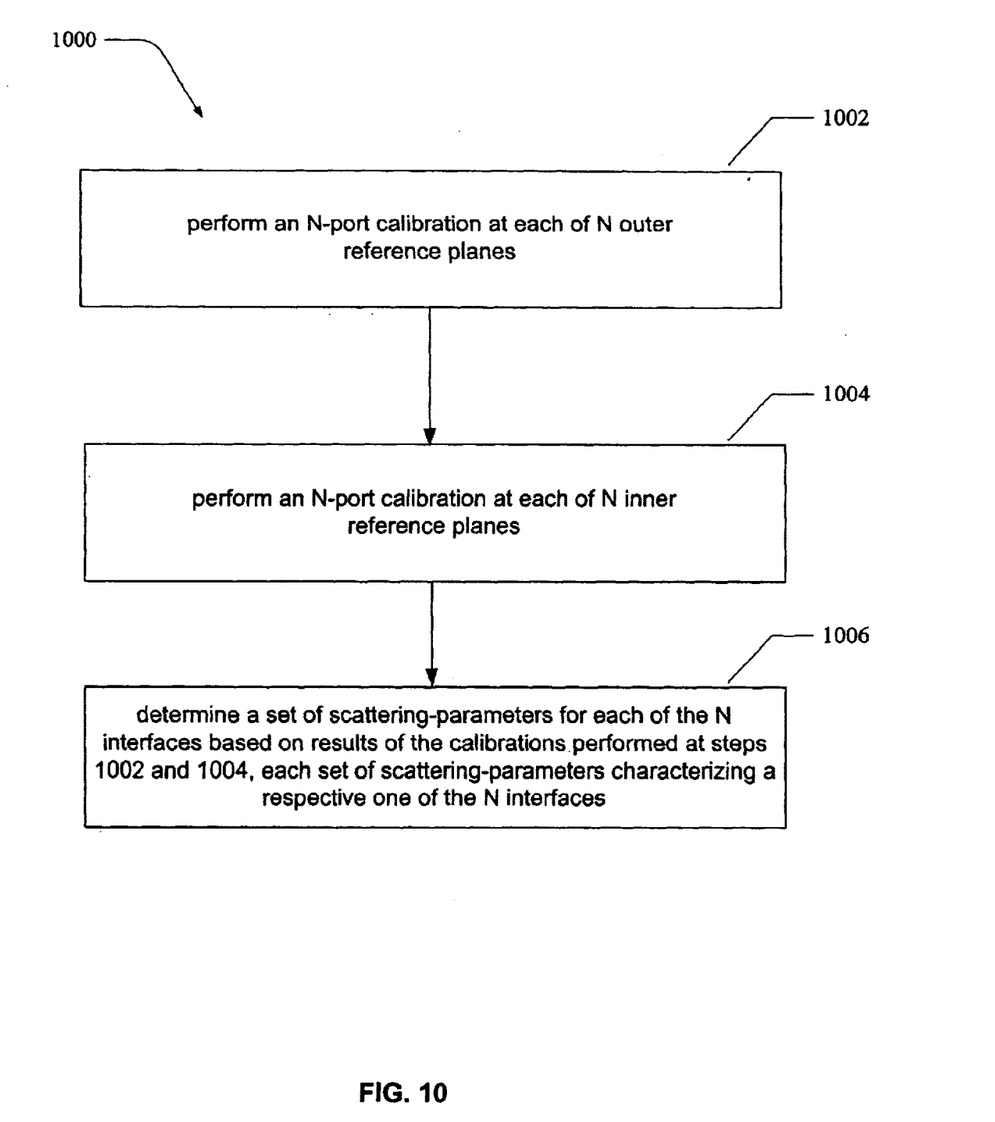
FIG. 10 is a flow diagram of the extraction method of the present invention.

Referring to FIG. 10, at a first step 1002 of the present invention, an N-port calibration is performed at each of N outer reference planes, where N is the number of interface devices, which is typically equal to the number of ports of the DUT. These calibrations are performed, for example, by connecting a short, open, load and thru at each of the N outer reference planes. In the example shown in FIGS. 9A and 9B, N=2. Thus, for the example of FIGS. 9A and 9B, at step 1002 a two-port calibration is performed at each of a first outer reference plane and a second outer reference plane. Each outer reference plane is defined by a first port of one of the N interface devices. The first port of the each interface device is for connecting to the VNA (e.g., directly to a port of the VNA, or to a cable that is attached to the port of the VNA). More specifically, a first outer reference plane 906a is defined by a first port of first interface device 904a and a second outer reference plane 906b is defined by a first port of second interface device 904b. The first port of first interface device 904a is for connecting to first port 902a of the VNA (directly, or through a cable). The first port of second interface device 904b is for connecting to second port 902b of the VNA (directly, or through a cable). Additional details of Step 1002 are discussed below.

At a next step 1004, an N-port calibration is performed at each of N inner reference planes. These calibrations are performed, for example, by connecting a short, open load and thru at each of the N inner reference planes. As mentioned above, in the example shown in FIGS. 9A and 9B, N=2. Thus, for the example of FIGS. 9A and 9B, at step 1004 a two port calibration is performed at each of a first inner reference plane and a second inner reference plane. Each of the inner reference planes is defined by a second port of one of the N interface devices. The second port of each interface is for connecting to one of the ports of the DUT. More specifically, a first inner reference plane 908a is defined by a second port of first interface device 904a and a second inner reference plane 908b is defined by a second port of second interface device 904b. The second port of first interface device 904a is for connecting to a first port of the DUT (not shown). The second port of second interface device 904b is for connecting to a second port of the DUT. Additional details of Step 1004 are discussed below.

Finally, at a step 1006 a set of S-parameters is determined for each of the N interface devices based on results of the calibrations performed at steps 1002 and results of the calibrations performed at step 1004. Each set of S-parameters characterizing a respective one of the N interface devices. Thus, for the example of FIGS. 9A and 9B, a first set of S-parameters is determined for interface device 904a, and a second set of S-parameters is determined for interface device 904b. Additional details of step 1006 are discussed below.

The calibrations performed at step 1002 produce a set of outer reference plane error coefficients for each of the N outer reference planes, including a directivity error coefficient (edn), a source match error coefficient (epnS), and a reflection tracking error coefficient (etnn). For the example of FIGS. 9A and 9B, a set of first outer reference plane error coefficients is produced, including a directivity error coefficient (ed1), a source match error coefficient (ep1S) and a reflection tracking error coefficient (et11). Additionally, a set of second outer reference plane error coefficients is produced, including a directivity error coefficient (ed2), a source match error coefficient (ep2S) and a reflection tracking error coefficient (et22).

The calibrations performed at step 1004 produce a set of inner reference plane error coefficients for each of the N inner reference planes, including a directivity error coefficient (edn'), a source match error coefficient (epnS'), and a reflection tracking error coefficient (etnn'). For the example of FIGS. 9A and 9B, a set of first inner reference plane error coefficients is produced, including a directivity error coefficient (ed1'), a source match error coefficient (ep1S') and a reflection tracking error coefficient (et11'). Additionally, a set of second inner reference plane error coefficients is produced, including a directivity error coefficient (ed2'), a source match error coefficient (ep2S') and a reflection tracking error coefficient (et22').

The error coefficients produced at steps 1002 and 1004, are then used at step 1006 to determine the S-parameters for each of the N interface devices. The set of S-parameters for the each of the N interface devices includes: $S^n_{11}$, $S^n_{12}$, $S^n_{21}$ and $S^n_{22}$. For the example of FIGS. 9A and 9B, the set of S-parameters for the first interface device include 904a includes: $S^1_{11}$, $S^1_{12}$, $S^1_{21}$ and $S^1_{22}$. Similarly, the set of S-parameters for the second interface device includes: $S^2_{11}$, $S^2_{12}$, $S^2_{21}$ and $S^2_{22}$. This step can be accomplished using the following equations, each of which was discussed above:

$$S^n_{11} = \frac{edn' - edn}{epnS(edn' - edn) + etnn};$$

$$S^n_{21}S^n_{12} = \frac{etnn'(1 - epnS \cdot S^n_{11})^2}{etnn}; \text{ and}$$

$$S^n_{22} = epnS' - \frac{S^n_{21}S^n_{12}epnS}{1 - epnS \cdot S^n_{11}}.$$

More specifically, for the example of FIGS. 9A and 9B, the set of S-parameters for first interface device 904a can be determined using the following equations:

$$S^1_{11} = \frac{ed1' - ed1}{ep1S(ed1' - ed1) + et11};$$

$$S^1_{21}S^1_{12} = \frac{et11'(1 - ep1S \cdot S^1_{11})^2}{et11}; \text{ and}$$

$$S^1_{22} = ep1S' - \frac{S^1_{21}S^1_{12}ep1S}{1 - ep1S \cdot S^1_{11}}.$$

Similarly, the set of S-parameters for second interface device 904b can be determined using the following equations:

$$S^2_{11} = \frac{ed2' - ed2}{ep2S(ed2' - ed2) + et22};$$

$$S^2_{21}S^2_{12} = \frac{et22'(1 - ep2S \cdot S^2_{11})^2}{et22}; \text{ and}$$

$$S^2_{22} = ep2S' - \frac{S^2_{21}S^2_{12}ep2S}{1 - ep2S \cdot S^2_{11}}.$$

Cross terms can also be obtained, if desired, using the equations shown below:

$$S^2_{12}S^1_{21} = \frac{et21'(1 - S^1_{11}ep1S)(1 - S^2_{11}ep2L)}{et21}$$

$$S^1_{12}S^2_{21} = \frac{et12'(1 - S^2_{11}ep2S)(1 - S^1_{11}ep1L)}{et12}.$$

Figure 11A:
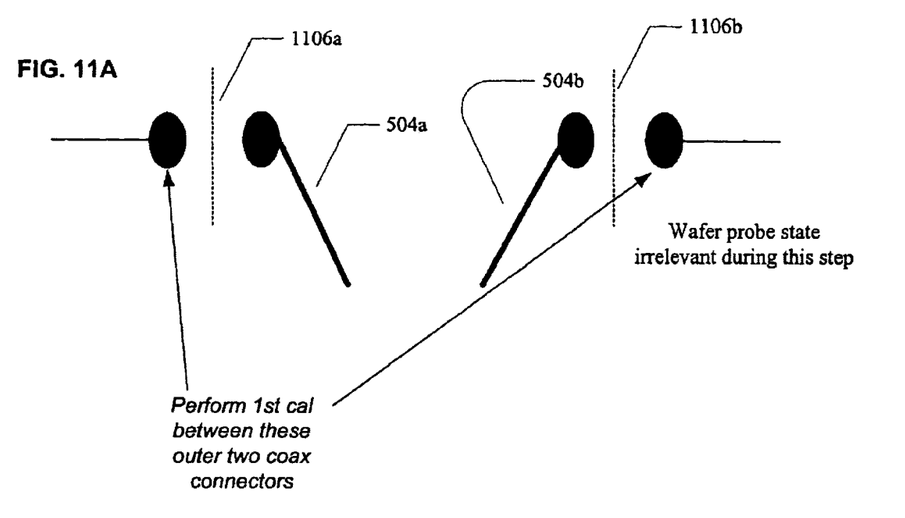
FIGS. 11A and 11B illustrate that the two wafer probe interface devices of FIG. 5 are useful for describing how the extracting method of the present invention can be applied.

It is simple to see how the extraction method in accordance with the present invention is different than methods A and B discussed above. To explain the differences between the extraction method in accordance with the present invention and method C discussed above, the wafer probe example presented with reference to FIGS. 5 and 6A–6C will be considered. Referring now to FIG. 11, in accordance with the present invention, the first step (i.e., Step 1002) is to perform outer calibrations as shown, which is very different from how method C is performed. Since there are two interface devices (i.e., wafer probe 504a and wafer probe 504b), a two-port calibration is performed at each of two outer reference planes. A first outer reference plane 1106a is defined by a first port of first wafer probe 504a (that connects first wafer probe 504a to a first port of a VNA, now shown). A second outer reference plane 1106b is defined by a first port of second wafer probe 504b (that connects second wafer probe 504b to a second port of the VNA). The outer calibrations are performed, for example, by connecting a short, open, load and thru at each of the outer reference planes 1106a and 1106b, and making appropriate measurements using the VNA. Importantly, it does not matter what is connected between the wafer probes during this step.

Figure 11B:
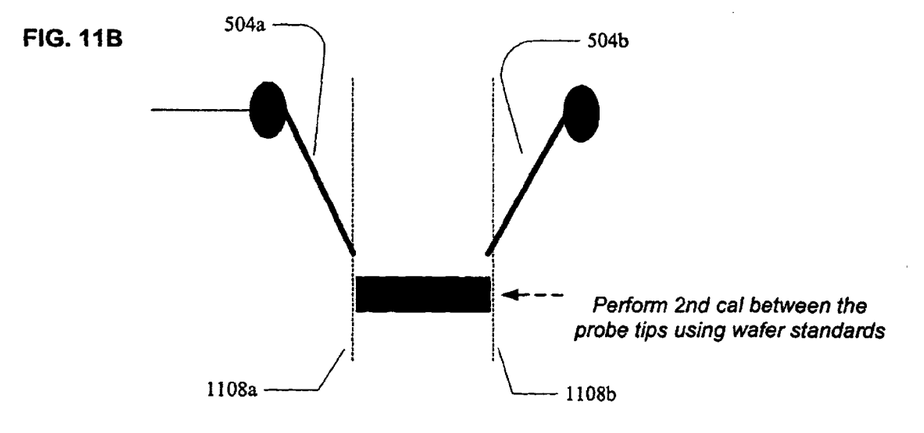

The next step (i.e., Step 1004) is to perform inner calibrations. Since there are two interface devices (i.e., wafer probe 504a and wafer probe 504b), a two-port calibration is performed at each of two inner reference planes. A first inner reference plane 1108a is defined by a second port of first wafer probe 504a (that connects to the wafer DUT). A second inner reference plane 1108b is defined by a second port of second wafer probe 504b (that connects to the wafer DUT). The inner calibrations are performed, for example, by connecting a short, open, load and thru at each of the inner reference planes, and making appropriate measurements using the VNA. For this example, wafer calibration standards are preferably used.

Next (i.e., at Step 1006), a set of S-parameters is determined for each of the interface devices based on results of the outer and inner calibrations. For this example, a first set of S-parameters is determined for first wafer probe 504a, and a second set of S-parameters is determined for second wafer probe 504*b*. Each set of S-parameters characterizes a respective one of the interface devices. The sets of S-parameters are determined using Equations 2, 3b and 4b discussed above. Equation 5 can be used if there is a need or desire to know $S^n{}_{12}$ and $S^n{}_{21}$ individually (rather than just the product $S^n{}_{12}S^n{}_{21}$).

An advantage of the method in accordance with the present invention is that only two calibration steps (i.e., Steps 1002 and 1004) are required. Importantly, there are still only two calibration steps required for any N-port system (even if N is greater than 2), although there will be N-port calibrations. Procedures for performing N-port calibrations are well known in the art. An N-port calibration can be performed using an N-port VNA, when available. Alternatively, methods for performing N-port calibrations using a VNA having less than N ports can be used. Examples of such known methods are described in the following articles, each of which are incorporated herein by reference in its entirety: J. C. Tippet et al. "A Rigourous Technique for Measuring Scatting Matrix of a Multiport Device with a 2-Port Network Analyzer," IEEE Trans. Microwave Theory Tech., vol. MTT-30, no. 5, pp 661–666, May 1982; and D. F. Williams et al. "In-Line Multiport Calibration Algorithm," Publication of National Standards and Technology. With the advent of automatic N-port calibrators, these steps are even faster and easier.

It would be apparent to one of ordinary skill in the relevant art that some of the steps of the method discussed with reference to FIG. 10 need not be performed in the exact order described. For example, step 1004 can be performed prior to step 1002. However, it would also be apparent to one of ordinary skill in the relevant art that some of the steps must be performed before others. For example, steps 1002 and 1004 must be performed prior to step 1006. This is because step 1006 uses the results of steps 1002 and 1004. The point is, the order of the steps is only important where a step uses results of another step. Accordingly, one of ordinary skill in the relevant art would appreciate that the present invention should not be limited to the exact order shown in FIG. 10.

Methods for determining the S-parameters of interface devices (e.g., adapters or test fixture arms) have been presented. Such methods are useful to help de-embed effects of an interface device from measured data. Unlike previous techniques, the methods in accordance with the present invention generate all S-parameters needed for de-embedding, are geometrically feasible for a tight fixtured or probing environment, and are much more amenable to use in a multiport fixtured environment. Due to the increasing use of such multiport testing in manufacturing, the time efficient technique of the present invention is quite important.

The previous description of the preferred embodiments of the present invention is provided to enable any person skilled in the art to make or use the present invention. While the invention has been particularly shown and described with reference to preferred embodiments thereof, it will be understood by those skilled in the art that various changes in form and details may be made therein without departing from the spirit and scope of the invention.

What is claimed is:

1. A method for characterizing a first interface device and a second interface device using a vector network analyzer (VNA), the first and second interface devices useful for connecting a two-port device under test (DUT) to the VNA, the method comprising the steps of:

(a) performing a two-port calibration at each of a first outer reference plane and a second outer reference plane;

(b) performing a two-port calibration at each of a first inner reference plane and a second inner reference plane; and (c) determining a set of scattering-parameters for each of the first and second interface devices based on results of the calibrations performed at step (a) and results of the calibrations performed at step (b), each set of scattering-parameters characterizing a respective one of the first and second interface devices.

2. The method of claim 1, wherein the first outer reference plane is defined by a first port of the first interface device and the second outer reference plane is defined by a first port of the second interface device, the first port of the first interface device for connecting to a first port of the VNA, the first port of the second interface device for connecting to a second port of the VNA.

3. The method of claim 1, wherein:

the first inner reference plane is defined by a second port of the first interface device; and the second inner reference plane is defined by a second port of the second interface device, the second port of the first interface device for connecting to a first port of the DUT, the second port of the second interface device for connecting to a second port of the DUT.

4. The method of claim 1, wherein step (a) comprises:

(a1) producing a set of first outer reference plane error coefficients including a directivity error coefficient (ed1), a source match error coefficient (ep1S), and a reflection tracking error coefficient (et11); and (a2) producing a set of second outer reference plane error coefficients including a directivity error coefficient (ed2), a source match error coefficient (ep2S), and a reflection tracking error coefficient (et22), wherein the results of the calibrations performed at step (a) includes the set of first outer reference plane error coefficients and the set of second outer reference plane error coefficients.

5. The method of claim 4, wherein step (b) comprises:

(b1) determining a set of first inner reference plane error coefficients including a directivity error coefficient (ed1'), a source match error coefficient (ep1S'), and a reflection tracking error coefficient (et11'); and (b2) determining a set of second inner reference plane error coefficients including a directivity error coefficient (ed2'), a source match error coefficient (ep2S'), and a reflection tracking error coefficient (et22'), wherein the results of the calibrations performed at step (b) includes the set of first inner reference plane error coefficients and the set of second inner reference plane error coefficients.

6. The method of claim 5, wherein:

the set of scattering-parameters for the first interface device includes $S^1{}_{11}$, $S^1{}_{12}$, $S^{121}$ and $S^1{}_{22}$; and the set of scattering-parameters for the second interface device includes $S^2{}_{11}$, $S^2{}_{12}$, $S^2{}_{21}$ and $S^2{}_{22}$.

7. The method of claim 6, wherein step (c) comprises:

(c1) determining the set of scattering-parameters for the first interface device in accordance with the following equations $$S^1_{11} = \frac{ed1' - ed1}{ep1S(ed1' - ed1) + et11};$$

-continued $$S_{21}^1 S_{12}^1 = \frac{et11'(1 - ep1S \cdot S_{11}^1)^2}{et11}; \text{ and}$$

$$S_{22}^1 = ep1S' - \frac{S_{21}^1 S_{12}^1 ep1S}{1 - ep1S \cdot S_{11}^1}.$$

(c2) determining the set of scattering-parameters for the second interface device in accordance with the following equations $$S_{11}^2 = \frac{ed2' - ed2}{ep2S(ed2' - ed2) + et22};$$

$$S_{21}^2 S_{12}^2 = \frac{et22'(1 - ep2S \cdot S_{11}^2)^2}{et22}; \text{ and}$$

$$S_{22}^2 = ep2S' - \frac{S_{21}^2 S_{12}^2 ep2S}{1 - ep2S \cdot S_{11}^2}.$$

8. The method of claim 1, wherein:
the first interface device comprises a first wafer probe; and
the second interface device comprises a second wafer probe,
the first wafer probe and second wafer probe being useful for connecting the DUT to the VNA, the DUT being a wafer.

9. The method of claim 1, wherein:
the first interface device comprises a first fixture arm of a test fixture; and
the second interface device comprises a second fixture arm of the test fixture,
the first fixture arm and the second fixture arm being useful for connecting the DUT to the VNA.

10. The method of claim 1, wherein:
the first interface device comprises a first adapter; and
the second interface device comprises a second adapter,
the first and second adapters being useful for connecting the DUT to the VNA.

11. A method for characterizing N interface devices using a vector network analyzer (VNA), the N interface devices useful for connecting an N-port device under test (DUT) to the VNA, where N is an integer$\geq 2$, the method comprising the steps of:
(a) performing an N-port calibration at each of N outer reference planes;
(b) performing an N-port calibration at each of N inner reference planes; and
(c) determining a set of scattering-parameters for each of the N interface devices based on results of the calibrations performed at steps (a) and results of the calibrations performed at step (b), each set of scattering-parameters characterizing a respective one of the N interface devices.

12. The method of claim 11, wherein each of the N outer reference planes is defined by a first port of the $n^{th}$ interface, the first port of the $n^{th}$ interface for connecting to the VNA.

13. The method of claim 11, wherein each of the N inner reference planes is defined by a second port of the $n^{th}$ interface, the second port of the $n^{th}$ interface for connecting to an $n^{th}$ port of the DUT.

14. The method of claim 11, wherein step (a) comprises producing a set of outer reference plane error coefficients for each of the N interface devices, each set including a directivity error coefficient (edn), a source match error coefficient (epnS), and a reflection tracking error coefficient (etnn),
the results of the calibrations performed at step (a) including the sets of outer reference plane error coefficients for the N interface devices.

15. The method of claim 14, wherein step (b) comprises determining a set of inner reference plane error coefficients for each of the N interface devices, each set including a directivity error coefficient (edn'), a source match error coefficient (epnS'), and a reflection tracking error coefficient (etnn'),
the results of the calibrations performed at step (b) including the sets of inner reference plane error coefficients for the N interface devices.

16. The method of claim 15, wherein the set of scattering-parameters for the each of the N interface devices include $S^n_{11}$, $S^n_{12}$, $S^n_{22}$ and $S^n_{22}$.

17. The method of claim 16, wherein step (c) comprises determining the set of scattering-parameters for the each of the N interface devices in accordance with the following equations:

$$S_{11}^n = \frac{edn' - edn}{epnS(edn' - edn) + etnn};$$

$$S_{21}^n S_{12}^n = \frac{etnn'(1 - epnS \cdot S_{11}^n)^2}{etnn}; \text{ and}$$

$$S_{22}^n = epnS' - \frac{S_{21}^n S_{12}^n epnS}{1 - epnS \cdot S_{11}^n}.$$

18. The method of claim 11, wherein each of the N interface devices comprises a wafer probe that is useful for connecting the DUT to the VNA, the DUT being a wafer.

19. The method of claim 11, wherein each of the N interface devices comprises a fixture arm of an N-port fixture that is useful for connecting an N-port device under test to the VNA.

20. The method of claim 11, wherein each of the N interface devices comprises an adapter that is useful for connecting the DUT to the VNA.

21. A method for characterizing a first interface device and a second interface device using a vector network analyzer (VNA), the first and second interface devices useful for connecting a two-port device under test (DUT) to the VNA, the method comprising the steps of:
(a) performing a two-port calibration at each of a first outer reference plane and a second outer reference plane in order to determine a first set of error coefficients for each port of the VNA, each first set of error coefficients relating to errors associated with a port of the VNA;
(b) performing a two-port calibration at each of a first inner reference plane and a second inner reference plane in order to determine a second set of error coefficients for each port of the VNA, each second set of error coefficients relating to errors associated with a port of the VNA plus errors associated with one of the interface devices; and
(c) determining a set of scattering-parameters for each of the first and second interface devices by extracting results of the calibrations performed at step (a) from results of the calibrations performed at step (b), each set of scattering-parameters characterizing a respective one of the first and second interface devices.

22. A method for characterizing N interface devices using a vector network analyzer (VNA), the N interface devices useful for connecting an N-port device under test (DUT) to the VNA, where N is an integer≧2, the method comprising the steps of:

(a) performing an N-port calibration at each of N outer reference planes;

(b) performing an N-port calibration at each of N inner reference planes; and (c) determining a set of scattering-parameters for each of the N interface devices by extracting results of the calibrations performed at step (a) from results of the calibrations performed at step (b), each set of scattering-parameters characterizing a respective one of the N interface devices.

* * * * *

UNITED STATES PATENT AND TRADEMARK OFFICE
CERTIFICATE OF CORRECTION

PATENT NO. : 6,650,123 B2
DATED : November 18, 2003
INVENTOR(S) : Jon S. Martens

It is certified that error appears in the above-identified patent and that said Letters Patent is hereby corrected as shown below:

Column 12,
Line 56, delete "$S^{121}$" and insert therefor -- $S^1_{21}$ --.

Column 14,
Line 17, delete "$S^n_{22}$" and insert therefor -- $S^n_{21}$ --.

Signed and Sealed this

Sixteenth Day of March, 2004

JON W. DUDAS
*Acting Director of the United States Patent and Trademark Office*